United States Patent
Hashimoto et al.

(10) Patent No.: US 7,507,058 B2
(45) Date of Patent: Mar. 24, 2009

(54) TOOL POSITIONING DEVICE AND MACHINING TOOL

(75) Inventors: Takayuki Hashimoto, Ebina (JP); Katsuhiro Nagasawa, Ebina (JP); Shintarou Takahashi, Ebina (JP)

(73) Assignee: Hitachi Via Mechanics, Ltd., Kanagawa (JP)

( * ) Notice: Subject to any disclaimer, the term of this patent is extended or adjusted under 35 U.S.C. 154(b) by 220 days.

(21) Appl. No.: 11/252,616

(22) Filed: Oct. 19, 2005

(65) Prior Publication Data

US 2006/0082076 A1    Apr. 20, 2006

(30) Foreign Application Priority Data

Oct. 20, 2004    (JP)    ............... 2004-306251

(51) Int. Cl.
 B23B 51/02    (2006.01)
(52) U.S. Cl. .................... 408/202; 408/226; 408/241 S
(58) Field of Classification Search ................. 408/202, 408/203, 241 S, 704, 53, 56, 14, 67, 87, 226; 279/20; 433/75
See application file for complete search history.

(56) References Cited

U.S. PATENT DOCUMENTS

| | | | | |
|---|---|---|---|---|
| 62,754 A | * | 3/1867 | Keith | 408/202 |
| 1,404,016 A | * | 1/1922 | Engelbrekt | 408/56 |
| 2,700,905 A | * | 2/1955 | Urquhart | 408/113 |
| 2,945,403 A | * | 7/1960 | Egger | 408/202 |
| 3,715,168 A | * | 2/1973 | Kuhn | 408/204 |
| 3,973,863 A | * | 8/1976 | Smith | 483/55 |
| 4,088,417 A | * | 5/1978 | Kosmowski | 408/1 R |
| 4,507,026 A | * | 3/1985 | Lund | 408/72 B |
| 4,658,494 A | * | 4/1987 | Ohtani et al. | 483/10 |
| 4,710,075 A | * | 12/1987 | Davison | 408/202 |
| 4,761,876 A | * | 8/1988 | Kosmowski | 483/1 |
| 4,762,447 A | * | 8/1988 | Marantette | 409/131 |
| 4,811,843 A | * | 3/1989 | Stribiak | 206/349 |
| 4,813,825 A | * | 3/1989 | Kosmowski | 408/98 |
| 4,922,603 A | * | 5/1990 | Kosmowski | 483/56 |
| 4,984,352 A | * | 1/1991 | Reed et al. | 483/1 |
| 5,102,271 A | * | 4/1992 | Hemmings | 408/226 |
| 5,111,573 A | * | 5/1992 | Ito et al. | 483/1 |
| 5,123,789 A | * | 6/1992 | Ohtani et al. | 408/1 R |
| 5,145,298 A | * | 9/1992 | Marantette | 409/135 |
| 5,147,164 A | * | 9/1992 | Fraver | 408/202 |
| 5,249,348 A | * | 10/1993 | Hall | 483/18 |
| 5,308,198 A | * | 5/1994 | Pumphrey | 408/1 R |
| 5,311,654 A | * | 5/1994 | Cook | 29/447 |
| 5,393,178 A | * | 2/1995 | Daraz | 409/234 |

(Continued)

FOREIGN PATENT DOCUMENTS

EP    171830 A1 *    2/1986

*Primary Examiner*—Daniel W Howell
(74) *Attorney, Agent, or Firm*—Wenderoth, Lind & Ponack, L.L.P.

(57) ABSTRACT

A tool positioning device and a machining element have simple structures which can reduce running cost. In addition to a hole that engages with a shank of an end mill, a channel is provided so that it penetrates through the device such that one end thereof communicates with an upper face of the device and the other end communicates with a lower end of the device. In this case, it is more effective to provide a concave portion that is opened to the upper face and communicates with the hole. The same effect may be obtained by making a cylindrical hole, for example, instead of the channel.

4 Claims, 6 Drawing Sheets

U.S. PATENT DOCUMENTS

| | | | |
|---|---|---|---|
| 5,429,504 A * | 7/1995 | Peltier et al. | 433/165 |
| 5,472,298 A * | 12/1995 | Mihai | 408/13 |
| 5,893,687 A * | 4/1999 | Oketani et al. | 408/97 |
| 6,022,176 A * | 2/2000 | Spangenberg | 408/16 |
| 6,059,296 A * | 5/2000 | Baeder | 279/20 |
| 6,227,777 B1 * | 5/2001 | Kosmowski | 409/231 |
| 6,514,258 B1 * | 2/2003 | Brown et al. | 606/80 |
| 6,789,986 B2 * | 9/2004 | Story, Jr. | 409/218 |
| 7,048,477 B2 * | 5/2006 | Abrams | 408/1 R |
| 2006/0008332 A1 * | 1/2006 | Greenberg et al. | 408/202 |

* cited by examiner

TOOL POSITIONING DEVICE AND MACHINING TOOL

FIELD OF THE INVENTION

The present invention relates to a cylindrical and hollow tool positioning device having a hole that fits with a tool to position an edge of the tool when attached with the tool and to a machining element using the same.

BACKGROUND TECHNOLOGY

FIG. 4 is a front view of a main part of a conventional printed board machining apparatus, FIGS. 5A and 5B are drawings showing a collet chuck section of the printed board machining apparatus, wherein FIG. 5A is a front section view thereof and FIG. 5B is a view taken in the direction of an arrow A in FIG. 5A. FIG. 6 is a front section view of a tool holding unit.

In FIG. 4, an X table 1 is movable in an X direction perpendicular to the face of the sheet. A tool holding unit 20 and a printed board 15 are placed on the X table 1. A Y table 2 is movable horizontally in a Y direction in the figure. The Y table 2 holds a Z table 3 so as to be movable vertically in the Z direction in the figure by a motor 4 having an encoder and a ball screw 5. The Z table 3 holds a spindle 6 that rotatably holds a tool (here an end mill) 8 through the intermediary of a collet chuck 7. An NC unit 9 controls rotation of the motor 4 to accurately position an edge 7a of the collet chuck 7.

As shown in FIGS. 5A and 5B, the collet chuck 7 has a hole 7b formed at the center thereof and slits 7s having a width of around 0.5 mm and provided at the edge portion thereof. The portion where the slits 7s are provided will be referred to as a claw portion 7d hereinafter (note that only the claw portion 7d is shown in FIG. 5A). The claw portion 7d is provided with a channel 7m in a middle part thereof. A pad 10 made of an elastic member is disposed in the channel 7m. A thickness of the pad 10 itself is thicker than a width of the slit 7s, so that the pad 10 urges the claw portion 7d in a direction of widening the slit 7s.

An outer periphery of the claw portion 7d is formed so as to have a tapered plane 7f having the same angle as a tapered plane 6f of the spindle 6. When the tapered plane 7f is separated from the tapered plane 6f by moving the collet chuck 7 downward in the figure by means not shown, the claw portion 7d is opened due to the resilience of the collet chuck 7 itself and the pad 10, and a diameter of the hole 7b becomes larger than that of a shank 8a of the end mill 8. When the collet chuck 7 is moved upward in the figure by the means not shown, and when it is urged further upward in a state when the tapered plane 7f abuts against the tapered plane 6f, the claw portion 7d is urged in a direction of narrowing the slit 7s, thus holding the shank 8a rigidly with frictional force.

The Z table 3 supports a pressure foot 11 by means of a pair of cylinders 12 that urges the pressure foot 11 downward in the figure. A ringed brush 13 is disposed at a bottom face of the pressure foot 11. It is noted that the pressure foot 11 is located at its rising end in the figure.

As shown in FIG. 6, a base 21 of a tool holding unit 20 supports a holder 22 so as to be movable in the vertical direction. A spring 23 urges the holder 22 upward. The holder 22 is provided with, at the center part thereof, a hole 22a whose diameter is larger than an outer diameter of the shank 8a of the end mill 8, i.e., the tool, or larger than a blade portion 8t when an outer diameter of the blade portion 8t is larger than the outer diameter of the shank 8a. Still more, the holder 22 is configured so that its upper face 22u reaches a preset height from the surface of the X table 1.

A ring 30 is made of hard synthetic resin, for example, and has a hole 30a which is provided at the center thereof and whose diameter is slightly smaller than the outer diameter of the shank 8a. As a result, when the shank 8a is inserted into the hole 30a, the ring 30 is combined in a body with the end mill 8 due to its resilience. That is, the ring 30 is a tool positioning device of the end mill 8. The holder 22 supports the end mill (machining tool) 8 attached with the ring 30. It is noted that the ring 30 has an outer diameter of around 7 to 8 mm and a height h of around 4 to 8 mm, and the shank 8a has the outer diameter of around 3 mm.

Next, an operation of the conventional printed board machining apparatus will be explained.

At first, a procedure for holding the end mill 8 with the spindle 6 will be explained. It is noted that the holder 22 supports the end mill 8 in a state in which it is inserted into the ring 30. Still more, the ring 30 is fixed with the end mill 8 so that a distance from a bottom face 30d thereof to a point 8p of the end mill 8 becomes a distance k. Accordingly, because a height h of the ring 30 in the vertical direction is preset, a distance from an upper face 30u of the ring 30 to the point 8p of the end mill 8 is determined.

The X and Y tables 1 and 2 are moved so that the axial center of the collet chuck 7, i.e., the spindle 6, coincides with an axial line of the hole 22a. Then, the Z table 3 is moved downward while opening the collet chuck 7 to position the edge 7a of the collet chuck 7 at position N indicated by a two-dot-chain line in FIG. 6. When the collet chuck 7 is closed in this state, the end mill 8 is held in a state in which the edge 7a of the chuck 7 contacts with the upper face 30u of the ring 30.

Next, a procedure for machining a channel on the printed board 15 will be explained.

After positioning the axial center of the end mill 8 to the center of the channel to be machined, the Z table 3 is moved downward while supplying air to the center part of the spindle 6 so that the point 8p of the end mill 8 cuts to a predetermined depth of the printed board 15. Then, the X and Y tables 1 and 2 are moved in accordance to a machining program. The air supplied to the center of the spindle flows out of the slits 7s of the collet chuck 7 and prevents chips from entering the slits 7s.

Because the use of the ring 30 enables one to accurately control the position of the point 8p of the end mill as described above, the cutting depth can be set at a required minimum value in machining the printed board, thus improving the machining efficiency. It also causes no insufficient cutting of the end mill 8. Still more, it becomes unnecessary to confirm the position of the point 8p during machining.

By the way, the life of the tool may be prolonged by suppressing an increase of temperature of the tool during machining. The prolongation of life of the tool not only improves the machining efficiency but also reduces running cost.

A linear and concave coolant supplying section in parallel with an axial line, from the rear end of the shank portion to a cutting face of the blade portion, to directly apply the coolant to the cutting face of the blade portion of the end mill is disclosed in Japanese Publication Patent No. 2894924. A plurality of independent cutting blades disposed in spiral in the axial direction on a rectangle whose width can be defined in the axial direction, so that an interval in the axial direction is wider than the cutting blade, is disclosed in Japanese Patent Laid-Open No. 2002-337016. A blow outlet of compressed air is disposed in the vicinity of the tool as disclosed in Japanese Patent Laid-Open No. 1997-117815.

However, because the channel is provided on the shank portion in both the conventional technologies disclosed in Japanese Publication Patent No. 2894924 and Japanese Patent Laid-Open No. 2002-337016, the unit cost of their tools becomes expensive as compared to a standard tool. Still more, because the structure of the tool disclosed in Japanese Patent Laid-Open No. 1997-117815 is complicated, its maintenance and inspection are cumbersome.

Accordingly, it is an object of the invention to provide a tool positioning device and a machining element which are capable of solving the above-mentioned problem, whose structures are simple, and which allow a running cost to be reduced.

SUMMARY OF THE INVENTION

In order to solve the above-mentioned problem, according to a first aspect of the invention, there is provided a hollow and cylindrical tool positioning device for positioning an edge of a tool. A hole penetrates through a center part of the device in an axial direction to attach the tool. An upper face is a plane orthogonal to the axial direction, a lower face is a plane orthogonal to the axial direction, and an outside face connects an outer edge of the upper face with an outer edge of the lower face. A hollow portion in the axial direction communicates with the upper and lower faces.

In this case, there may be provided a concave portion that communicates with the hole and is opened to the upper face and one end of the hollow portion may communicate with the upper face via the concave portion.

The hollow portion may communicate with the hole across the whole range thereof in the axial direction.

The hollow portion may be a channel provided on an outside face of the device or may be a cylindrical hole.

According to another aspect of the invention, there is provided a machining element wherein the tool positioning device described above is removably attached with a shank portion of the tool having the shank portion and a blade portion.

The invention described above allows a standard tool to be used and the life of the tool to be prolonged, so that the running cost may be reduced. Still more, the invention requires no change in the structure of a printed board machining apparatus, so that it is applicable to the conventional printed board machining apparatus.

Still more, because the inventive device is provided with the concave portion, it requires no positioning of a channel in the collet chuck with the hollow portion, thus facilitating the work of attaching the tool to the collet chuck and holding the tool in the tool holding unit.

Further, because air flows along the surface of the tool in using the apparatus, the tool cooling effect may be enhanced.

According to the invention, the hollow portion may be readily formed, so that the tool positioning device and the machining element may be formed at low cost.

It is noted that the summary of the invention described above does not necessarily describe all necessary features of the invention. The invention may also be a sub-combination of the features described above.

BRIEF DESCRIPTION OF DRAWINGS

FIGS. 1A and 1B show an inventive ring, wherein FIG. 1A is a plan view thereof and FIG. 1B is a front section view.

FIGS. 3A and 3B show a ring according to a modified example of the invention, wherein FIG. 3A is a plan view thereof and FIG. 3B is a front section view.

FIGS. 5A and 5B show a collet chuck portion, wherein FIG. 5A is a front section view thereof and FIG. 5B is a view taken in the direction of an arrow A in FIG. 5A.

DETAILED DESCRIPTION OF THE INVENTION

The invention will now be described based on preferred embodiments, which are not intended to limit the scope of the invention, but exemplify the invention. All of the features and the combinations thereof described in the embodiments are not necessarily essential to the invention.

Figure 1A:
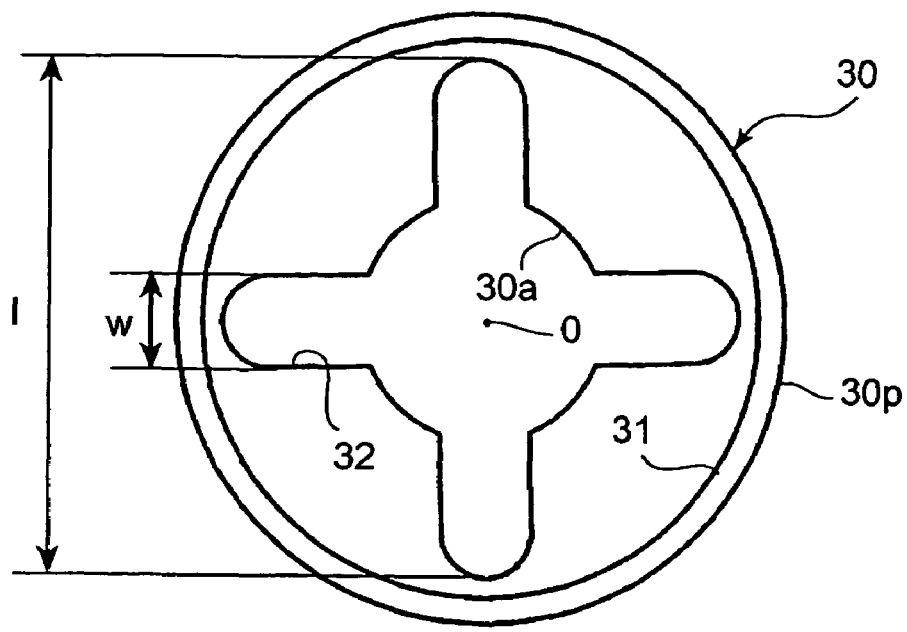
Figure 1B:
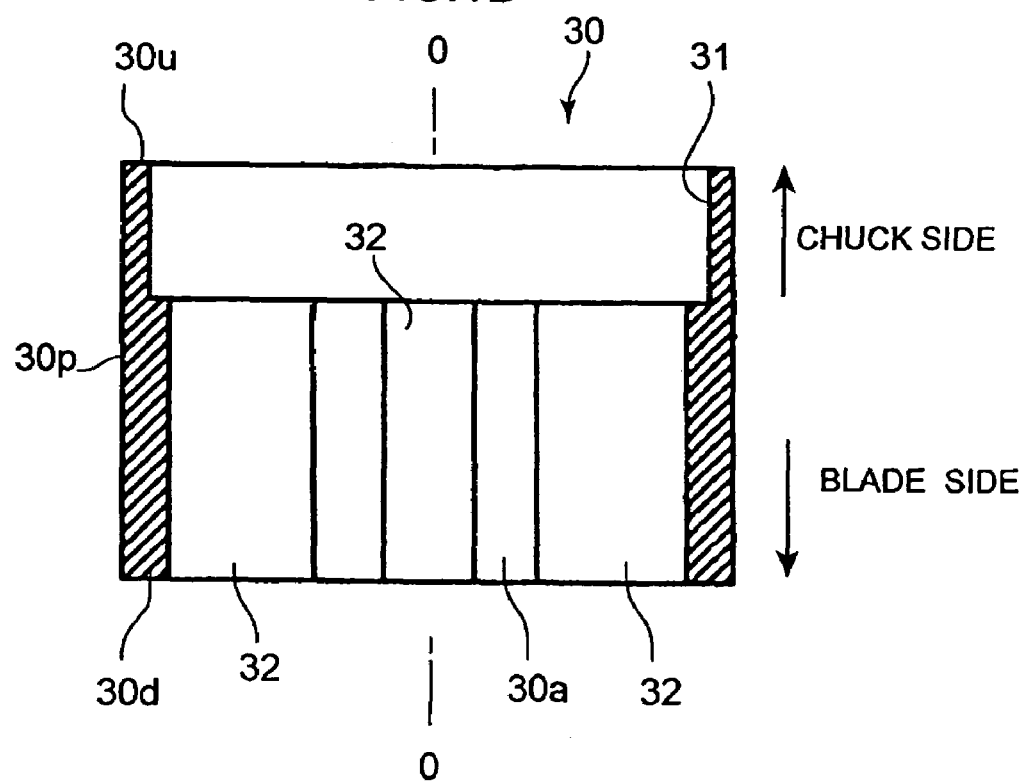
Figure 4:
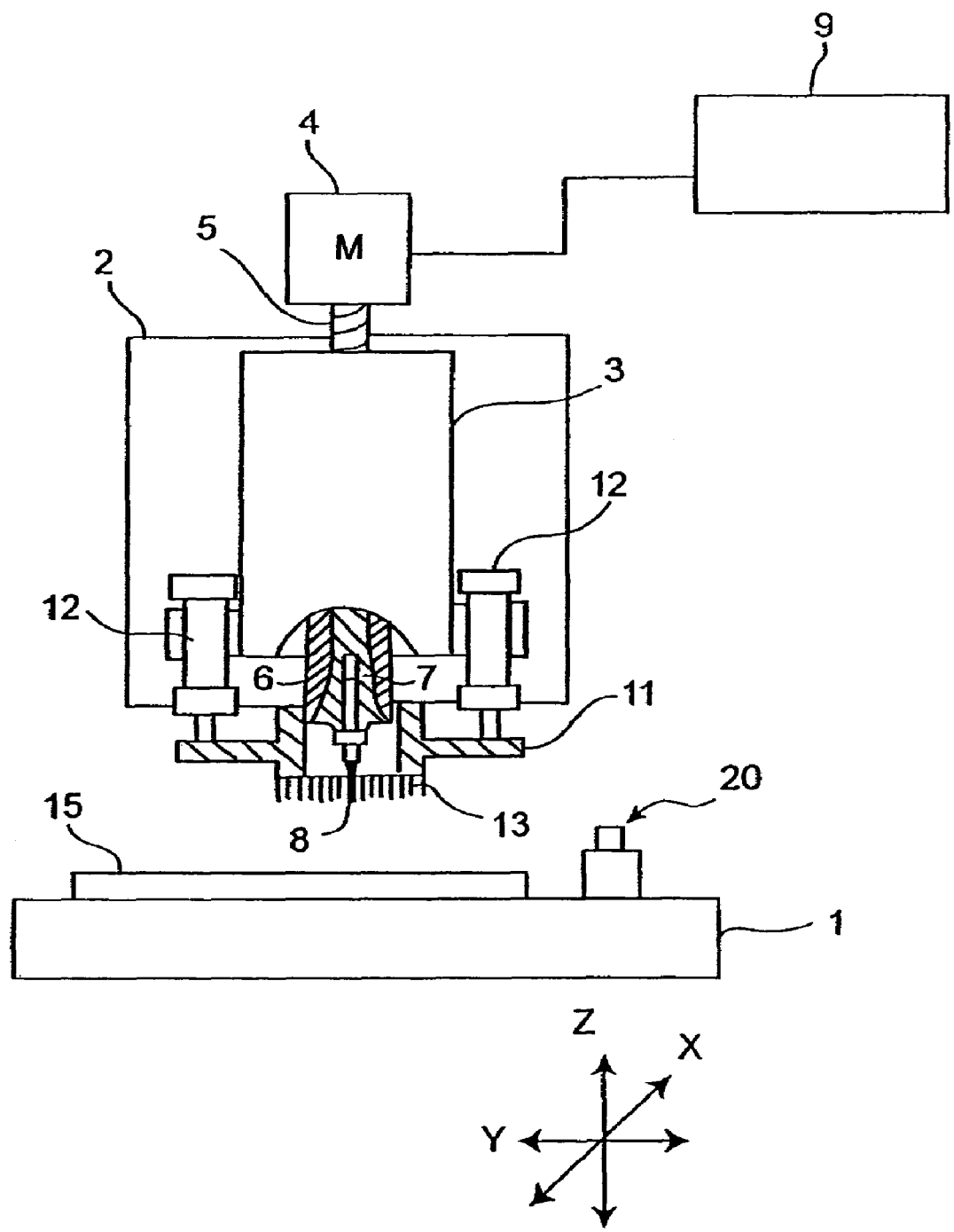
FIG. 4 is a front view of a main part of a printed board machining apparatus to which the invention is applicable.
Figure 5A:
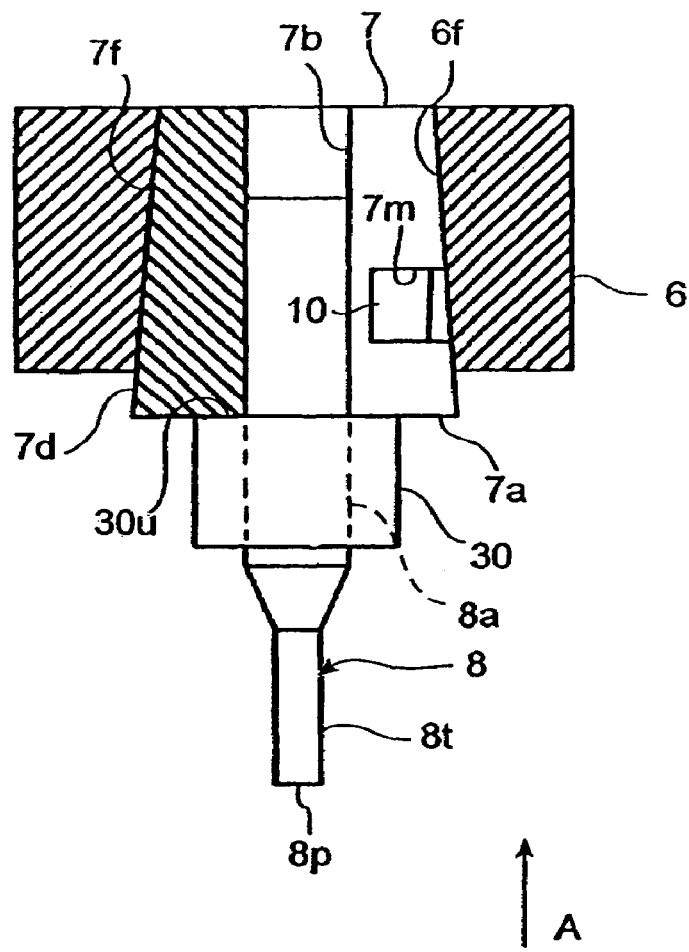
Figure 5B:
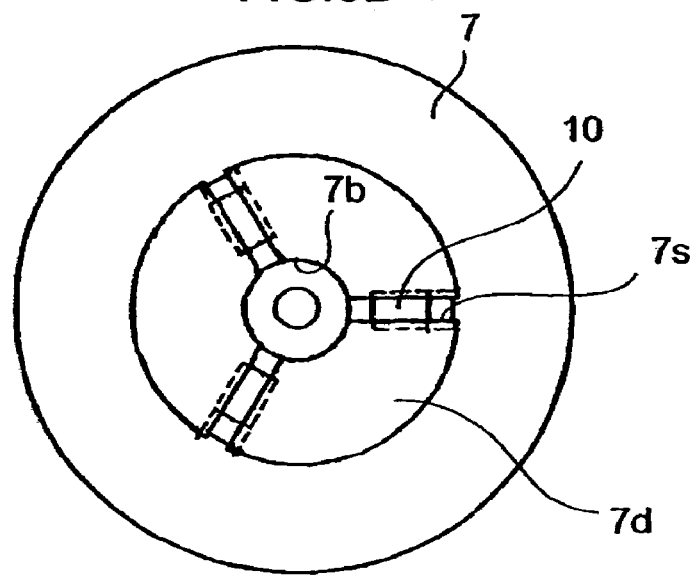
Figure 6:
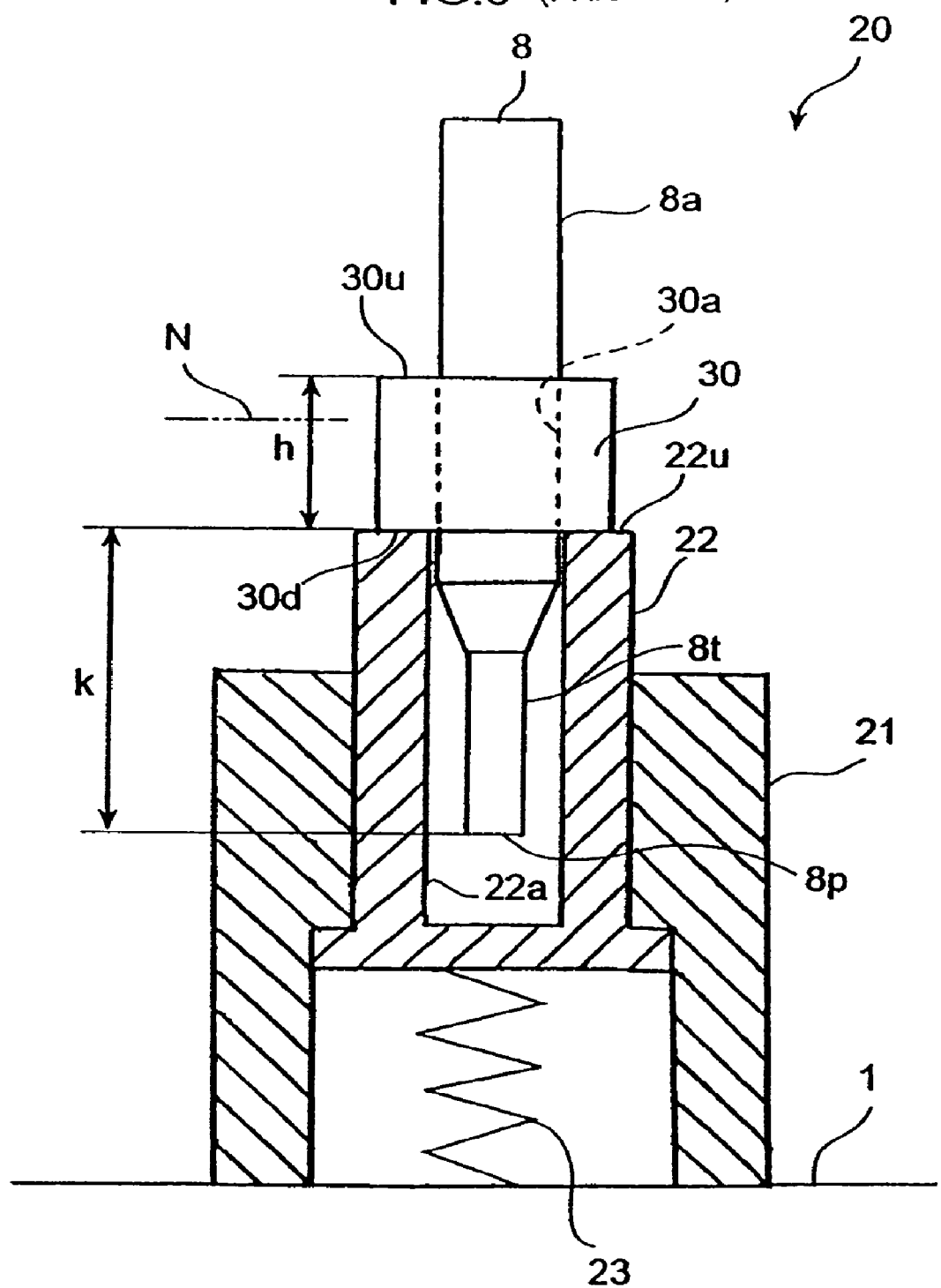
FIG. 6 is a front section view of a tool holding unit.

FIGS. 1A and 1B show an inventive ring, wherein FIG. 1A is a plan view thereof and FIG. 1B is a front section view. It is noted that parts therein which are the same or have the same function with those shown in FIGS. 4 through 6 will be denoted by the same reference numerals and overlapping explanation thereof will be omitted here.

The inventive ring (tool positioning device) 30 has a hole 30a that penetrates through a center part of the device in an axial direction (O-O) to attach the tool. An upper face 30u is a plane orthogonal to the axial direction. A lower face 30d is a plane orthogonal to the axial direction. An outside face 30p connects an outer edge of the upper face with an outer edge of the lower face. It is then provided with a concave portion 31 that opens to the upper face 30u of the ring 30 and communicates with the hole 30a and four channels (hollow portions) 32 that communicate with the hole 30a across the whole length of the hole 30a in the axial direction and are formed in parallel with the axial line of the hole 30a. The upper end of the channel 32 communicates with the upper face 30u through the concave portion 31 and the lower end thereof communicates with a lower end 30d, penetrating through the ring in the axial direction. Then, in using the inventive ring 30, it is attached to an end mill (tool) 8 so that the concave portion 31 faces to the side of a collet chuck 7.

Because the ring 30 is constructed as described above, a part of the air supplied to the axial center part of a spindle 6, which flows out of the collet chuck 7, enters the concave portion 31 and flows out of the lower face 30d of the ring 30 after passing through the channels 32. At this time, the air flows along the shank 8a, so that the end mill 8 is cooled due to heat transmission. The part of the air flowing out of the ring 30 also cools down a blade portion 8t.

As a result, even if the flow amount of air fed to the axial center part of the spindle, i.e., air flowing to the collet chuck 7, is equalized with that of the conventional device, the end mill 8 is cooled down effectively.

Figure 2:
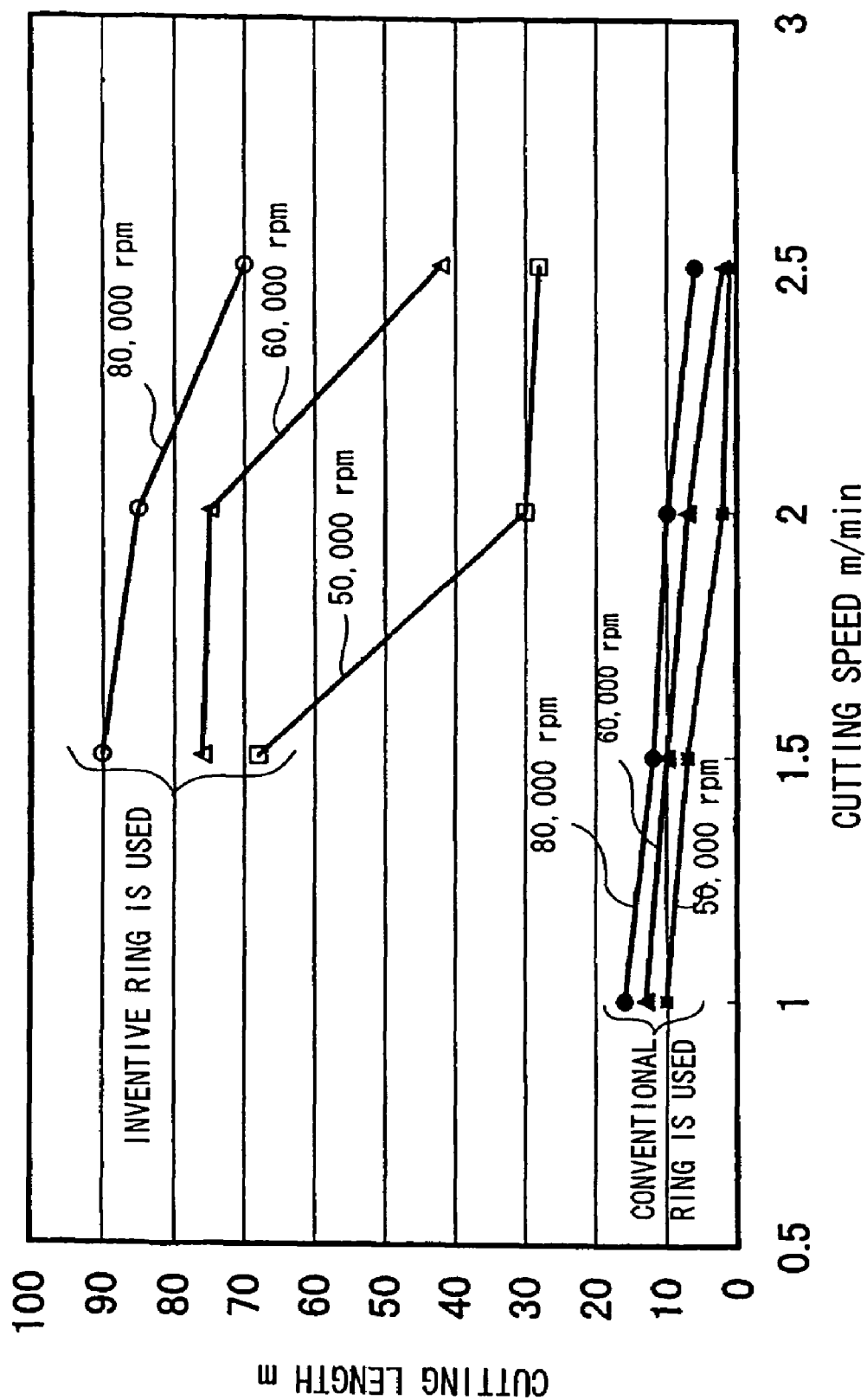
FIG. 2 is a graph showing machining results when the invention is applied.

FIG. 2 is a graph showing machining results of the tool when the inventive ring is applied. The abscissa represents cutting speeds and the ordinate represents cutting lengths. Results of using the conventional ring are also shown for the purpose of comparison.

The test has been carried out under the following conditions:
 (1) Outer diameter of the blade portion of the end mill 8: 1 mm;
 (2) Rotational speed of the spindle: 50,000 rpm, 60,000 rpm and 80,000 rpm;

(3) A flow amount of air supplied to the center part of the spindle: 50 l/min.; and (4) Work: A pile of three glass epoxy resin boards (glass content: 20 wt. %) having a thickness of 1 mm.

It is noted that the number of channels 32 has been four, their width w has been 1.5 mm and a length l across the both ends of the channels 32 located on a diameter has been 5 mm. Still more, the diameter of the hole 30a has been 3.0 mm and the diameter of the shank 8a has been 3.175 mm.

As is apparent from the graph, the inventive ring can increase the cutting length by eight to ten times as compared to that of the conventional ring.

That is, because the invention allows the cutting speed to be increased, the machining efficiency may be improved. Still more, because the invention allows the cutting length to be prolonged, the number of times of replacement of the tool may be reduced when the cutting length is the same. Accordingly, the invention allows the machining efficiency to be improved further.

Still more, because the invention allows a standard tool to be used, the running cost may be reduced.

Further, because the invention allows the ring 30 to be used repeatedly, the running cost may be reduced.

The concave portion 31 is provided in the embodiment described above, so that it becomes unnecessary to adjust the position of the slit 7s of the collet chuck 7 with the channel 32, thus facilitating the work of attaching the end mill 8 with the collet chuck 7 and holding the end mill 8 with the holder 22.

It is noted that although four channels have been provided in the embodiment, the number is not limited to be four and even one channel will do. Still more, the channel 32 may be formed into a spiral shape instead of a linear shape.

Further, it is not always necessary to provide the concave portion 31.

Figure 3A:
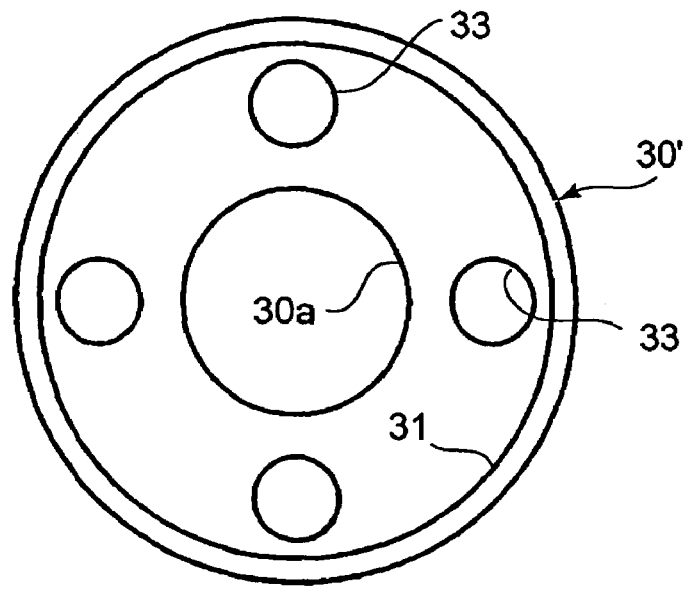
Figure 3B:
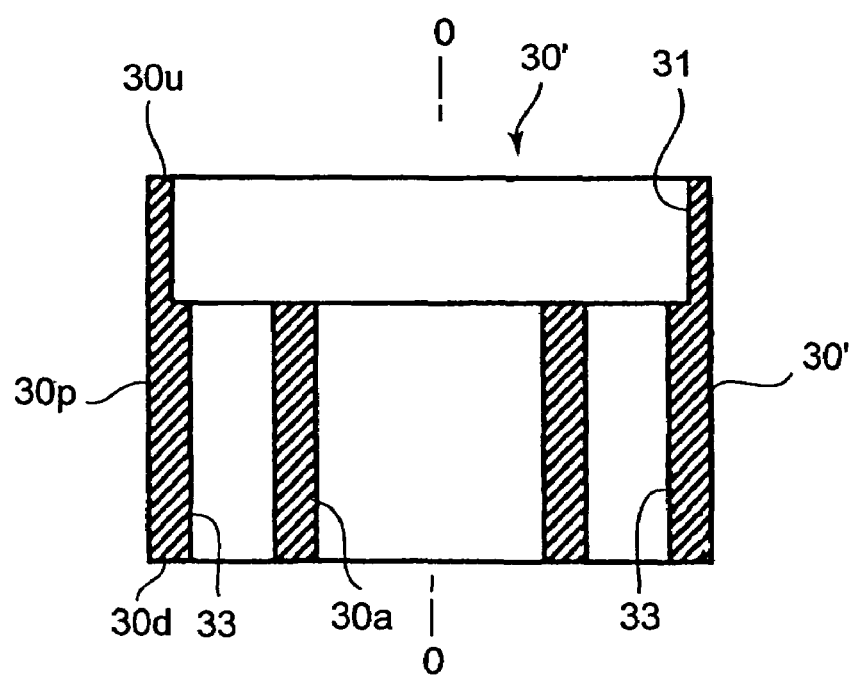

FIGS. 3A and 3B show a structure of a ring 30' according to a modification of the invention, wherein FIG. 3A is a plan view thereof and FIG. 3B is a front section view.

The cutting length may be prolonged and the machining efficiency may be improved in the same manner as described above by providing holes (hollow portions) 33, instead of the channels 32, as shown in the figures.

It is noted that although the linear or spiral channel 32 may be provided on the outside face 30p of the ring 30, the cooling effect is apt to drop when the channel 32 is provided on the side face of the ring 30 as compared to the case described above.

Still more, in the invention, a large amount of air is supplied to the outer periphery of the blade portion as compared to the conventional case, so that chips caused by the machining are blown upward. As a result, dust collecting efficiency improves when the inside of the pressure foot is connected with a dust collector, reducing the chips remaining on the surface of the printed board and within the machined channels.

Although the case when the tool is an end mill has been explained above, the invention is also applicable to a case when the tool is a drill and to other tools as well.

Although the invention has been described by way of the exemplary embodiments, it should be understood that those skilled in the art might make many changes and substitutions without departing from the spirit and scope of the invention. It is obvious from the definition of the appended claims that the embodiments with such modifications also belong to the scope of the invention.

What is claimed is:

1. A machining element held by a chuck having slits and a lower face, said machining element comprising the combination of a hollow and cylindrical tool positioning device and a tool having an edge that is positioned by said device, said combination comprising:

a hole, penetrating through a center part of said device in an axial direction of said device, receiving and holding a shank portion of the tool therein, said hole having a diameter smaller than the diameter of the shank portion of the tool;

an upper face on said device located on a plane orthogonal to said axial direction, said upper face abutting the lower face of the chuck;

a lower face on said device on a plane orthogonal to said axial direction;

an outside face connecting an outer edge of said upper face with an outer edge of said lower face;

a plurality of hollow portions extending through said device in the axial direction for allowing air to flow through said device, said hollow portions communicating with said upper face and said lower face, and said hollow portions communicating with said hole in said device along the entire extent of said hollow portions in the axial direction for having air flowing through said hollow portions flow along the tool; and a concave portion opening to said upper face of said device, communicating with said hole, and communicating with one end of said hollow portions such that said hollow portions communicate with said upper face via said concave portion, said concave portion forming a circle that (1) is concentric with said hole and (2) has a diameter such that said concave portion encompasses all of said hollow portions as viewed along the axial direction, wherein said concave portion has an area in a plane perpendicular to the axial direction that is greater than the area of said hollow portions, and whereby air from the slits of the chuck can flow to the hollow portions through said concave portion.

2. The combination of claim 1 wherein said tool positioning device is removably attached to said shank portion.

3. A machining element held by a chuck having slits and a lower face, said machining element comprising the combination of a tool positioning device and a tool having an edge that is positioned by said device, said combination comprising:

a cylindrical body having an upper end and a lower end, said upper end abutting the lower face of the chuck;

a hole extending through a center part of said body in an axial direction of said body receiving and holding a shank portion of the tool therein, said hole having a diameter smaller than the diameter of the shank portion of the tool;

a plurality of hollow portions extending through said device in the axial direction for allowing air to flow through said device, said plurality of hollow portions communicating with said upper end and said lower end, and said plurality of hollow portions being open to and communicating with said hole in said device along the entire extent of said plurality of hollow portions in the axial direction so that cooling air can flow through said plurality of hollow portions to flow along the tool for cooling the tool; and a concave portion opening to said upper end of said device, said concave portion communicating with said hole and with one end of said plurality of hollow portions such that said plurality of hollow portions communicate with said upper end via said concave portion, so that cooling air can be received in said concave portion to flow into said plurality of hollow portions for cooling the tool, said concave portion forming a circle that (1) is concentric with said hole and (2) has a diameter such that said concave portion encompasses all of said hollow portions as viewed along the axial direction, wherein said concave portion has an area in a plane perpendicular to the axial direction that is greater than the area of said hollow portions, and whereby air from the slits of the chuck can flow to the hollow portions through said concave portion.

4. The combination of claim 3 wherein said tool positioning device is removably attached to said shank portion.

* * * * *